(12) United States Patent
Deng et al.

(10) Patent No.: US 12,181,531 B2
(45) Date of Patent: Dec. 31, 2024

(54) WARNING METHOD AND APPARATUS FOR BATTERY THERMAL RUNAWAY, MEDIUM, AND DEVICE

(71) Applicant: BYD COMPANY LIMITED, Shenzhen (CN)

(72) Inventors: Linwang Deng, Shenzhen (CN); Yonggang Yin, Shenzhen (CN); Tianyu Feng, Shenzhen (CN); Sijia Liu, Shenzhen (CN)

(73) Assignee: BYD COMPANY LIMITED, Shenzhen (CN)

( * ) Notice: Subject to any disclaimer, the term of this patent is extended or adjusted under 35 U.S.C. 154(b) by 212 days.

(21) Appl. No.: 17/994,730

(22) Filed: Nov. 28, 2022

(65) Prior Publication Data

US 2023/0093420 A1   Mar. 23, 2023

Related U.S. Application Data

(63) Continuation of application No. PCT/CN2021/094162, filed on May 17, 2021.

(30) Foreign Application Priority Data

May 29, 2020 (CN) .......................... 202010476565.2

(51) Int. Cl.
*G01R 31/3835* (2019.01)
*G01K 1/14* (2021.01)
(Continued)

(52) U.S. Cl.
CPC ........... *G01R 31/3835* (2019.01); *G01K 1/14* (2013.01); *G01K 3/005* (2013.01); *H01M 10/486* (2013.01)

(58) Field of Classification Search
CPC ........ G01K 1/14; G01K 3/005; G01R 31/382; G01R 31/3835; H01M 10/42;
(Continued)

(56) References Cited

U.S. PATENT DOCUMENTS

2013/0260192 A1* 10/2013 LePort ................. H01M 10/48
429/62

FOREIGN PATENT DOCUMENTS

CN    107664542 A    2/2018
CN    109786872 A    5/2019
(Continued)

OTHER PUBLICATIONS

Pan et al.; Translation of CN110370984A; Pub. Date Oct. 25, 2019; Translated by EPO & Google (Year: 2019).*
(Continued)

*Primary Examiner* — Eman A Alkafawi
*Assistant Examiner* — Rahul Maini
(74) *Attorney, Agent, or Firm* — Wenye Tan

(57) ABSTRACT

A warning method for battery thermal runaway includes: acquiring current temperature data of each temperature sensor arranged in a battery pack, current voltage data of each voltage sensor arranged in the battery pack, and current sensor disconnection data of each temperature sensor; calculating a number of occurrences of a primary feature at a current moment according to the current temperature data; calculating a number of occurrences of a secondary feature at the current moment according to the current voltage data and the current sensor disconnection data in a case that the number of occurrences of the primary feature is greater than 0; calculating a sum of the number of occurrences of the primary feature and the number of occurrences of the secondary feature at the current moment; and sending a
(Continued)

warning for battery thermal runaway when the sum is greater than a preset feature number threshold.

12 Claims, 2 Drawing Sheets

(51) Int. Cl.
  *G01K 3/00* (2006.01)
  *H01M 10/48* (2006.01)
(58) Field of Classification Search
  CPC .......... H01M 10/4207; H01M 10/425; H01M 10/48; H01M 10/486; H01M 2010/4271; H01M 2220/20; Y02E 60/10
  USPC ....... 324/425, 426, 431, 433, 434, 435, 441, 324/443, 444, 446
  See application file for complete search history.

(56) References Cited

FOREIGN PATENT DOCUMENTS

| | | |
|---|---|---|
| CN | 110350258 A | 10/2019 |
| CN | 110370984 A | 10/2019 |
| CN | 110525219 A | 12/2019 |
| CN | 110696680 A | 1/2020 |
| CN | 110911772 A | 3/2020 |
| CN | 110276925 B | 10/2021 |

OTHER PUBLICATIONS

Wang et al.; Translation of CN110911772A; Pub. Date Mar. 24, 2020; Translated by EPO & Google (Year: 2020).*
The World Intellectual Property Organization (WIPO) International Search Report for PCT/CN2021/094162 Aug. 12, 2021 6 pages (with translation).

* cited by examiner

WARNING METHOD AND APPARATUS FOR BATTERY THERMAL RUNAWAY, MEDIUM, AND DEVICE

CROSS-REFERENCE TO RELATED APPLICATIONS

The present application is a continuation application of PCT application No. PCT/CN2021/094162 filed on May 17, 2021, which claims priority to Chinese Patent Application No. 202010476565.2, filed on May 29, 2020, and entitled "WARNING METHOD AND APPARATUS FOR BATTERY THERMAL RUNAWAY, MEDIUM, AND DEVICE". The entire content of all of the above-referenced applications is incorporated herein by reference.

FIELD

The present disclosure relates to the field of battery management technologies, and more specifically, to a warning method and apparatus for battery thermal runaway, a medium, and a device.

BACKGROUND

A warning for battery thermal runaway is usually realized by monitoring a battery pack by using various temperature sensors, voltage sensors, smoke sensors, air pressure sensors, and the like. However, more sensors mean more costs and more complex designs for the battery pack. In addition, a high-temperature airflow, a flame, and the like generated during the thermal runaway damage structures correlated with the battery pack such as the sensors and harnesses, resulting in a loss of an effective signal from the sensors and a failure to correctly identify the thermal runaway. In addition, if the sensors fail, a false alarm is easily generated.

SUMMARY

The present disclosure provides a warning method and apparatus for battery thermal runaway, a medium, and a device, to improve realize more accurate and quicker warning for battery thermal runaway.

According to a first aspect, the present disclosure provides a warning method for battery thermal runaway, including: acquiring current temperature data of each temperature sensor arranged in a battery pack, current voltage data of each voltage sensor arranged in the battery pack, and current sensor disconnection data of each temperature sensor; calculating a number of occurrences of a primary feature at a current moment according to the current temperature data, where the primary feature includes an abnormal-temperature feature of the temperature sensor; the number of occurrences of the primary feature at the current moment is a sum of the numbers of occurrences of the abnormal-temperature feature of all of the temperature sensors arranged in the battery pack at the current moment; calculating a number of occurrences of a secondary feature at the current moment according to the current voltage data and the current sensor disconnection data in a case that the number of occurrences of the primary feature is greater than 0, where the secondary feature includes an abnormal-voltage feature of the voltage sensor and a sensor disconnection feature of the temperature sensor; the number of occurrences of the secondary feature at the current moment is a sum of occurrences of the sensor disconnection feature of all of the temperature sensors arranged in the battery pack at the current moment and occurrences of the abnormal-voltage feature of all of the voltage sensors at the current moment; calculating a sum of the number of occurrences of the primary feature and the number of occurrences of the secondary feature at the current moment; and sending a warning for battery thermal runaway in a case that the sum is greater than a preset feature number threshold.

According to another aspect, the present disclosure provides a warning apparatus for battery thermal runaway, including: an acquisition module, configured to acquire current temperature data of each temperature sensor arranged in a battery pack, current voltage data of each voltage sensor arranged in the battery pack, and current sensor disconnection data of each temperature sensor; a statistics module, configured to calculate a number of occurrences of a primary feature at a current moment according to the current temperature data, and calculate a number of occurrences of a secondary feature at the current moment according to the current voltage data and the current sensor disconnection data in a case that the number of occurrences of the primary feature is greater than 0, where the primary feature includes an abnormal-temperature feature of the temperature sensor; the number of occurrences of the primary feature at the current moment is a sum of the numbers of occurrences of the abnormal-temperature feature of all of the temperature sensors arranged in the battery pack at the current moment; the secondary feature includes an abnormal-voltage feature of the voltage sensor and a sensor disconnection feature of the temperature sensor; and the number of occurrences of the secondary feature at the current moment is a sum of occurrences of the sensor disconnection feature of all of the temperature sensors arranged in the battery pack at the current moment and occurrences of the abnormal-voltage feature of all of the voltage sensors at the current moment; a calculation module, configured to calculate a sum of the number of occurrences of the primary feature and the number of occurrences of the secondary feature at the current moment; and a warning module, configured to send a warning for battery thermal runaway in a case that the sum is greater than a preset feature number threshold.

According to another aspect, the present disclosure provides a non-transitory computer-readable storage medium storing a computer program for, when executed by at least one processor, the processor to perform: acquiring current temperature data of each temperature sensor arranged in a battery pack, current voltage data of each voltage sensor arranged in the battery pack, and current sensor disconnection data of each temperature sensor; calculating a number of occurrences of a primary feature at a current moment according to the current temperature data, where the primary feature includes an abnormal-temperature feature of the temperature sensor; the number of occurrences of the primary feature at the current moment is a sum of the numbers of occurrences of the abnormal-temperature feature of all of the temperature sensors arranged in the battery pack at the current moment; calculating a number of occurrences of a secondary feature at the current moment according to the current voltage data and the current sensor disconnection data in a case that the number of occurrences of the primary feature is greater than 0, where the secondary feature includes an abnormal-voltage feature of the voltage sensor and a sensor disconnection feature of the temperature sensor; the number of occurrences of the secondary feature at the current moment is a sum of occurrences of the sensor disconnection feature of all of the temperature sensors arranged in the battery pack at the current moment and occurrences of the abnormal-voltage feature of all of the voltage sensors at the current moment; calculating a sum of the number of occurrences of the primary feature and the number of occurrences of the secondary feature at the current moment; and sending a warning for battery thermal runaway in a case that the sum is greater than a preset feature number threshold.

Other features and advantages of the present disclosure will be described in detail in the following detailed description part.

DETAILED DESCRIPTION

Certain specific implementations of the present disclosure are described in detail below with reference to the accompanying drawings. It should be understood that the specific implementations described herein are merely used to describe and explain the present disclosure, but are not intended to limit the present disclosure.

Figure 1:
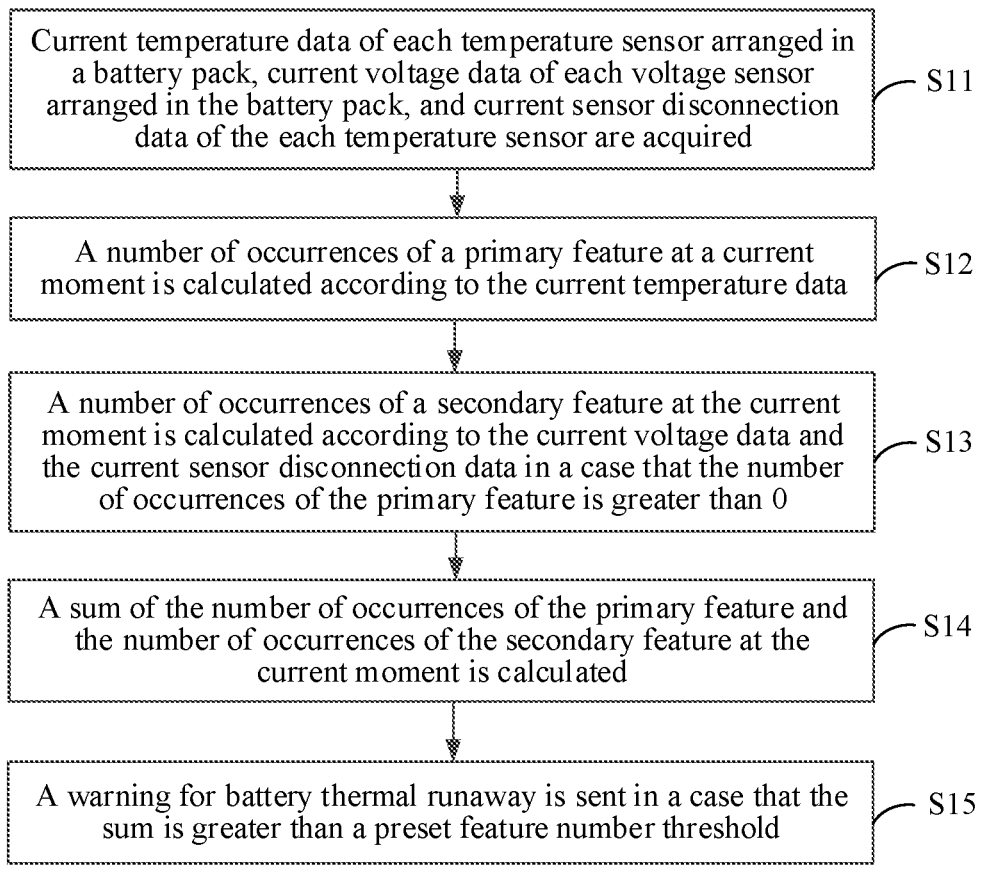
FIG. 1 is a flowchart of a warning method for battery thermal runaway according to an embodiment of the present disclosure.

FIG. 1 is a flowchart of a warning method for battery thermal runaway according to an embodiment of the present disclosure. As shown in FIG. 1, the method includes the following steps S11 to S15.

Step S11: Current temperature data of each temperature sensor arranged in a battery pack, current voltage data of each voltage sensor arranged in the battery pack, and current sensor disconnection data of each temperature sensor are acquired.

For example, M1 temperature sensors and M2 voltage sensors are arranged in the battery pack. The current temperature data sensed by the M1 temperature sensors, the current voltage data sensed by the M2 voltage sensors, and the current sensor disconnection data of the M1 temperature sensors are acquired. The current temperature data, the current voltage data, and the current sensor disconnection data may be obtained from a battery management system, or may be directly acquired from the temperature sensor and the voltage sensor respectively.

Step S12: A number of occurrences of a primary feature at a current moment is calculated according to the current temperature data, where the primary feature includes an abnormal-temperature feature of the temperature sensor; and the number of occurrences of the primary feature at the current moment is a sum of the numbers of occurrences of the abnormal-temperature feature of all of the temperature sensors arranged in battery pack at the current moment.

In a case that the current temperature data includes a current temperature and a current temperature rise rate, the abnormal-temperature feature includes the current temperature of the temperature sensor in the battery pack exceeding a preset temperature threshold and/or the current temperature rise rate of the temperature sensor in the battery pack exceeding a preset temperature rise rate threshold.

An initial value of a number n1 of occurrences of the primary feature is 0 during calculation at the beginning of each moment. For example, the initial value of the number n1 of occurrences of the primary feature is 0 during calculation at the beginning of a previous moment, and the initial value of the number n1 of occurrences of the primary feature is reset to 0 during calculation at the beginning of the current moment.

In this step, it may be first determined whether the current temperature data sensed by an $i^{th}$ temperature sensor in the M1 temperature sensors triggers the following two conditions: (1) the current temperature of the temperature sensor exceeds the preset temperature threshold, that is, Ti>Tmax, where Ti is a current temperature sensed by the $i^{th}$ temperature sensor, and Tmax is the preset temperature threshold; and (2) the current temperature rise rate of the temperature sensor exceeds the preset temperature rise rate threshold, that is, Ti−T'i>Smax, where T'i is a temperature at the previous moment sensed by the $i^{th}$ temperature sensor, and Smax is the preset temperature rise rate threshold.

In the present disclosure, the temperature rise rate is a difference between the current temperature of the temperature sensor and the temperature at the previous moment.

Each time one of the above two conditions is triggered, the value of the number n1 of occurrences of the primary feature is increased by 1. For example, assuming that the current temperature sensed by the $i^{th}$ temperature sensor exceeds the preset temperature threshold, the value of the number n1 of occurrences of the primary feature is increased by 1. If the current temperature rise rate of the $i^{th}$ temperature sensor also exceeds the preset temperature rise rate threshold, the value of the number n1 of occurrences of the primary feature is further increased by 1. After all of the current temperature data of all of the M1 temperature sensors is determined, the value of the number n1 of occurrences of the primary feature is equal to the sum of the numbers of occurrences of the primary feature of all of the temperature sensors in the battery pack at the current moment, so that a final number n1 of occurrences of the primary feature at the current moment is obtained.

Step S13: A number of occurrences of a secondary feature at the current moment is calculated according to the current voltage data and the current sensor disconnection data in a case that the number of occurrences of the primary feature is greater than 0 (which indicates that the primary feature is detected), where the secondary feature includes an abnormal-voltage feature of the voltage sensor and a sensor disconnection feature of the temperature sensor; the number of occurrences of the secondary feature at the current moment is a sum of occurrences of the sensor disconnection feature of all of the temperature sensors arranged in the battery pack at the current moment and occurrences of the abnormal-voltage feature of all of the voltage sensors at the current moment.

In this step, it may be successively determined according to current sensor disconnection signals of the temperature sensors whether the M1 temperature sensors are disconnected, and a number n2_T of disconnected temperature sensors may be calculated. In addition, it is successively determined whether the current voltage data of the M2 voltage sensors is abnormal, and a number n2_V of abnormal-voltage sensors is calculated. Specifically, determining whether the current voltage data of a $j^{th}$ voltage sensor is abnormal means determining whether the current voltage data satisfies any of the following conditions: the voltage sensor is disconnected, a current voltage of the voltage sensor is greater than a preset voltage upper limit, or the current voltage of the voltage sensor is less than a preset voltage lower limit. In this case, the number of occurrences of the secondary feature at the current moment is n2=n2_T+ n2_V Initial values of n2, n2_T, and n2_V are all 0 during calculation at the beginning of each moment. For example, the initial values of n2, n2_T, and n2_V are 0 during calculation at the beginning of the previous moment, and the initial values of n2, n2_T, and n2_V are reset to 0 during calculation at the beginning of the current moment.

In the present disclosure, the disconnection of the temperature sensor means that a circuit where the temperature sensor is arranged is disconnected and therefore temperature detection is not allowed, and the disconnection of the voltage sensor means that a circuit where the voltage sensor is arranged is disconnected and therefore voltage detection is not allowed.

In addition, if the number of occurrences of the primary feature is equal to 0, it means that no primary feature is detected at the current moment. Therefore, it may be determined that no thermal runaway occurs, and further calculation of the number of occurrences of the secondary feature is not required. According to the method in the embodiments of the present disclosure, the temperature data and the voltage data at a next moment are to be processed.

Step S14: A sum of the number of occurrences of the primary feature and the number of occurrences of the secondary feature at the current moment is calculated, that is, N=n1+n2.

Step S15: A warning for battery thermal runaway is sent in a case that the sum N is greater than a preset feature number threshold Nmax, which means that a thermal runaway fault is detected at the current moment.

If the sum N is not greater than the preset feature number threshold Nmax, it means that no thermal runaway fault is detected at the current moment. According to the method in the embodiments of the present disclosure, the temperature data and the voltage data at a next moment are to be processed.

According to the above technical solution, the thermal runaway feature is classified into the primary feature and the secondary feature, and the secondary feature is used only after the primary feature is triggered. In this way, the rate of false alarm of thermal runaway can be reduced, and more quick responses can be made to thermal runaway. In addition, since the temperature information and the voltage disconnection information are properly used, the rate of missing alarm of thermal runaway can be reduced. In addition, the method in the embodiments of the present disclosure does not require more hardware costs. Therefore, the accuracy and the speed of warning for thermal runaway are improved merely by a simple method.

Figure 2:
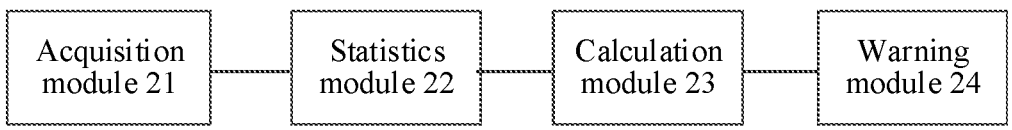
FIG. 2 is a schematic block diagram of a warning apparatus for battery thermal runaway according to an embodiment of the present disclosure.

FIG. 2 is a schematic block diagram of a warning apparatus for battery thermal runaway according to an embodiment of the present disclosure. As shown in FIG. 2, the apparatus includes: an acquisition module 21, configured to acquire current temperature data of each temperature sensor arranged in a battery pack, current voltage data of each voltage sensor arranged in the battery pack, and current sensor disconnection data of each temperature sensor; a statistics module 22, configured to calculate a number of occurrences of a primary feature at a current moment according to the current temperature data, and calculate a number of occurrences of a secondary feature at the current moment according to the current voltage data and the current sensor disconnection data in a case that the number of occurrences of the primary feature is greater than 0, where the primary feature includes an abnormal-temperature feature of the temperature sensor; the number of occurrences of the primary feature at the current moment is a sum of the numbers of occurrences of the abnormal-temperature feature of all of the temperature sensors arranged in the battery pack at the current moment; the secondary feature includes an abnormal-voltage feature of the voltage sensor and a sensor disconnection feature of the temperature sensor; and the number of occurrences of the secondary feature at the current moment is a sum of occurrences of the sensor disconnection feature of all of the temperature sensors arranged in the battery pack at the current moment and occurrences of the abnormal-voltage feature of all of the voltage sensors at the current moment; a calculation module 23, configured to calculate a sum of the number of occurrences of the primary feature and the number of occurrences of the secondary feature at the current moment; and a warning module 24, configured to send a warning for battery thermal runaway in a case that the sum is greater than a preset feature number threshold.

According to the above technical solution, the thermal runaway feature is classified into the primary feature and the secondary feature, and the secondary feature is used only after the primary feature is triggered. In this way, the rate of false alarm of thermal runaway can be reduced, and more quick responses can be made to thermal runaway. In addition, since the temperature information and the voltage disconnection information are properly used, the rate of missing alarm of thermal runaway can be reduced. In addition, the method in the embodiments of the present disclosure does not require more hardware costs. Therefore, the accuracy and the speed of warning for thermal runaway are improved merely by a simple method.

Optionally, in a case that the current temperature data includes a current temperature and a current temperature rise rate, the abnormal-temperature feature includes the current temperature of the temperature sensor in the battery pack exceeding a preset temperature threshold and/or the current temperature rise rate of the temperature sensor in the battery pack exceeding a preset temperature rise rate threshold.

Optionally, the abnormal-voltage feature includes the voltage sensor in the battery pack being disconnected, a current voltage of the voltage sensor in the battery pack being greater than a preset voltage upper limit, and a current voltage of the voltage sensor in the battery pack being less than a preset voltage lower limit.

Optionally, the warning module 24 is further configured to determine that no thermal runaway occurs in a case that the number of occurrences of the primary feature is equal to 0.

A specific operation mode of each module in the above apparatus in the above embodiment has been described in detail in the embodiment related to the method, and therefore details are not described herein.

Figure 3:
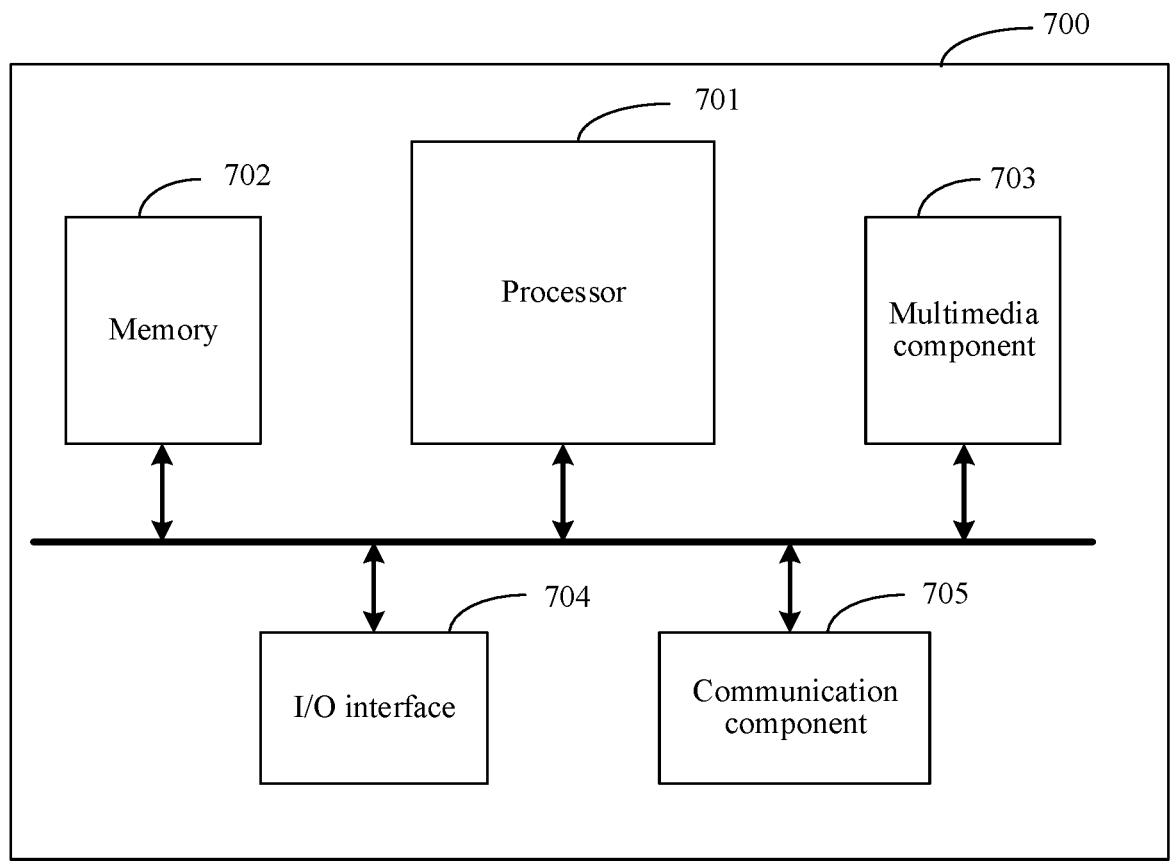
FIG. 3 is a block diagram of an electronic device according to an exemplary embodiment of the present disclosure.

FIG. 3 is a block diagram of an electronic device 700 according to an exemplary embodiment of the present disclosure. As shown in FIG. 3, the electronic device 700 may include a processor 701 and a memory 702. The electronic device 700 may further include one or more of a multimedia component 703, an input/output (I/O) interface 704, or a communication component 705.

The processor 701 is configured to control overall operations of the electronic device 700 to complete all or some steps in the above warning method for battery thermal runaway. The memory 702 is configured to store various types of data supporting operations on the electronic device 700. The data may include, for example, instructions of any application or method operating on the electronic device 700 and data related to the application, such as contact data and received/transmitted messages, pictures, audios, and videos. The memory 702 may be implemented by any type of volatile or non-volatile storage device or a combination thereof, such as a static random access memory (SRAM for short), an electrically erasable programmable read-only memory (EEPROM for short), an erasable programmable read-only memory (EPROM for short), a programmable read-only memory (PROM for short), a read-only memory (ROM for short), a magnetic memory, a flash memory, and a disk or an optical disk. The multimedia component 703 may include a screen and an audio component. The screen may be, for example, a touch screen, and the audio component is configured to output and/or input an audio signal. For example, the audio component may include a microphone for receiving an external audio signal. The received audio signal may be further stored in the memory 702 or sent through the communication component 705. The audio component further includes at least one speaker for outputting the audio signal. The I/O interface 704 provides an interface between the processor 701 and other interface modules. The other interface modules may be a keyboard, a mouse, buttons, or the like. The buttons may be virtual buttons or physical buttons. The communication component 705 is configured to perform wired or wireless communication between the electronic device 700 and other devices. The wireless communication includes, for example, Wi-Fi, Bluetooth, near field communication (NFC for short), 2G, 3G, or 4G, or a combination of one or more thereof. Therefore, correspondingly, the communication component 705 may include a Wi-Fi module, a Bluetooth module, or an NFC module.

In an exemplary embodiment, the electronic device 700 may be implemented by one or more of an application specific integrated circuit (ASIC for short), a digital signal processor (DSP for short), a digital signal processing device (DSPD for short), a programmable logic device (PLD for short), a field programmable gate array (FPGA for short), a controller, a microcontroller, a microprocessor, or other electronic elements to perform the above warning method for battery thermal runaway.

In another exemplary embodiment, a computer-readable storage medium storing a computer program is further provided. When the computer program is executed by a processor, the steps of the above warning method for battery thermal runaway are implemented. For example, the computer-readable storage medium may be the above memory 702 including a program instruction. The program instruction may be executed by the processor 701 of the electronic device 700 to complete the above warning method for battery thermal runaway.

The preferred implementations of the present disclosure are described in detail above with reference to the accompanying drawings, but the present disclosure is not limited to the specific details in the above implementations. Various simple variations may be made to the technical solutions of the present disclosure within the scope of the technical idea of the present disclosure, and such simple variations shall all fall within the protection scope of the present disclosure.

It should be additionally noted that, the specific technical features described in the foregoing specific implementations may be combined in any proper manner in a case without conflict. To avoid unnecessary repetition, various possible combination manners are not described in the present disclosure.

In addition, different implementations of the present disclosure may also be arbitrarily combined without departing from the idea of the present disclosure, and these combinations shall still be regarded as content disclosed in the present disclosure.

What is claimed is:

1. A warning method for battery thermal runaway, comprising:
   acquiring current temperature data of each temperature sensor arranged in a battery pack, current voltage data of each voltage sensor arranged in the battery pack, and current sensor disconnection data of each temperature sensor;
   calculating a number of occurrences of a primary feature at a current moment according to the current temperature data, wherein the primary feature comprises an abnormal-temperature feature of the temperature sensor; the number of occurrences of the primary feature at the current moment is a sum of the numbers of occurrences of the abnormal-temperature feature of all of the temperature sensors arranged in the battery pack at the current moment;
   calculating a number of occurrences of a secondary feature at the current moment according to the current voltage data and the current sensor disconnection data in a case that the number of occurrences of the primary feature is greater than 0, wherein the secondary feature comprises an abnormal-voltage feature of the voltage sensor and a sensor disconnection feature of the temperature sensor; the number of occurrences of the secondary feature at the current moment is a sum of occurrences of the sensor disconnection feature of all of the temperature sensors arranged in the battery pack at the current moment and occurrences of the abnormal-voltage feature of all of the voltage sensors at the current moment;
   calculating a sum of the number of occurrences of the primary feature and the number of occurrences of the secondary feature at the current moment; and
   sending a warning for battery thermal runaway in a case that the sum is greater than a preset feature number threshold.

2. The method according to claim 1, wherein the current temperature data comprises a current temperature and a current temperature rise rate; and the abnormal-temperature feature comprises the current temperature of the temperature sensor in the battery pack exceeding a preset temperature threshold and/or the current temperature rise rate of the temperature sensor in the battery pack exceeding a preset temperature rise rate threshold.

3. The method according to claim 1, wherein the abnormal-voltage feature comprises the voltage sensor in the battery pack being disconnected, a current voltage of the voltage sensor in the battery pack being greater than a preset voltage upper limit, and a current voltage of the voltage sensor in the battery pack being less than a preset voltage lower limit.

4. The method according to claim 1, further comprising: determining that no thermal runaway occurs in a case that the number of occurrences of the primary feature is equal to 0.

5. A warning apparatus for battery thermal runaway, comprising:
   an acquisition module, configured to acquire current temperature data of each temperature sensor arranged in a battery pack, current voltage data of each voltage sensor arranged in the battery pack, and current sensor disconnection data of each temperature sensor;
   a statistics module, configured to calculate a number of occurrences of a primary feature at a current moment according to the current temperature data, and calculate a number of occurrences of a secondary feature at the current moment according to the current voltage data and the current sensor disconnection data in a case that the number of occurrences of the primary feature is greater than 0, wherein the primary feature comprises an abnormal-temperature feature of the temperature sensor; the number of occurrences of the primary feature at the current moment is a sum of the numbers of occurrences of the abnormal-temperature feature of all of the temperature sensors arranged in the battery pack at the current moment; the secondary feature comprises an abnormal-voltage feature of the voltage sensor and a sensor disconnection feature of the temperature sensor; and the number of occurrences of the secondary feature at the current moment is a sum of occurrences of the sensor disconnection feature of all of the temperature sensors arranged in the battery pack at the current moment and occurrences of the abnormal-voltage feature of all of the voltage sensors at the current moment;

a calculation module, configured to calculate a sum of the number of occurrences of the primary feature and the number of occurrences of the secondary feature at the current moment; and a warning module, configured to send a warning for battery thermal runaway in a case that the sum is greater than a preset feature number threshold.

6. The apparatus according to claim 5, wherein the current temperature data comprises a current temperature and a current temperature rise rate; and the abnormal-temperature feature comprises the current temperature of the temperature sensor in the battery pack exceeding a preset temperature threshold and/or the current temperature rise rate of the temperature sensor in the battery pack exceeding a preset temperature rise rate threshold.

7. The apparatus according to claim 5, wherein the abnormal-voltage feature comprises the voltage sensor in the battery pack being disconnected, a current voltage of the voltage sensor in the battery pack being greater than a preset voltage upper limit, and a current voltage of the voltage sensor in the battery pack being less than a preset voltage lower limit.

8. The apparatus according to claim 5, wherein the warning module is further configured to determine that no thermal runaway occurs in a case that the number of occurrences of the primary feature is equal to 0.

9. A non-transitory computer-readable storage medium storing a computer program for, when executed by at least one processor, the processor to perform:

acquiring current temperature data of each temperature sensor arranged in a battery pack, current voltage data of each voltage sensor arranged in the battery pack, and current sensor disconnection data of each temperature sensor;

calculating a number of occurrences of a primary feature at a current moment according to the current temperature data, wherein the primary feature comprises an abnormal-temperature feature of the temperature sensor; the number of occurrences of the primary feature at the current moment is a sum of the numbers of occurrences of the abnormal-temperature feature of all of the temperature sensors arranged in the battery pack at the current moment;

calculating a number of occurrences of a secondary feature at the current moment according to the current voltage data and the current sensor disconnection data in a case that the number of occurrences of the primary feature is greater than 0, wherein the secondary feature comprises an abnormal-voltage feature of the voltage sensor and a sensor disconnection feature of the temperature sensor; the number of occurrences of the secondary feature at the current moment is a sum of occurrences of the sensor disconnection feature of all of the temperature sensors arranged in the battery pack at the current moment and occurrences of the abnormal-voltage feature of all of the voltage sensors at the current moment;

calculating a sum of the number of occurrences of the primary feature and the number of occurrences of the secondary feature at the current moment; and sending a warning for battery thermal runaway in a case that the sum is greater than a preset feature number threshold.

10. The non-transitory computer-readable storage medium according to claim 9, wherein the current temperature data comprises a current temperature and a current temperature rise rate; and the abnormal-temperature feature comprises the current temperature of the temperature sensor in the battery pack exceeding a preset temperature threshold and/or the current temperature rise rate of the temperature sensor in the battery pack exceeding a preset temperature rise rate threshold.

11. The non-transitory computer-readable storage medium according to claim 9, wherein the abnormal-voltage feature comprises the voltage sensor in the battery pack being disconnected, a current voltage of the voltage sensor in the battery pack being greater than a preset voltage upper limit, and a current voltage of the voltage sensor in the battery pack being less than a preset voltage lower limit.

12. The non-transitory computer-readable storage medium according to claim 9, wherein the processor is further to perform: determining that no thermal runaway occurs in a case that the number of occurrences of the primary feature is equal to 0.

* * * * *